(12) United States Patent
Zhai

(10) Patent No.: US 10,403,849 B2
(45) Date of Patent: Sep. 3, 2019

(54) FLEXIBLE DISPLAY PANEL AND FLEXIBLE DISPLAY DEVICE

(71) Applicant: WUHAN TIANMA MICRO-ELECTRONICS CO., LTD., Wuhan (CN)

(72) Inventor: Yingteng Zhai, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/865,193

(22) Filed: Jan. 8, 2018

(65) Prior Publication Data

US 2018/0145278 A1 May 24, 2018

(30) Foreign Application Priority Data

Aug. 16, 2017 (CN) .......................... 2017 1 0711741

(51) Int. Cl.
*H01L 51/00* (2006.01)
*H01L 51/52* (2006.01)
(Continued)

(52) U.S. Cl.
CPC ............ *H01L 51/5246* (2013.01); *C09J 9/02* (2013.01); *C09J 11/04* (2013.01); *C09J 201/00* (2013.01); *H01L 23/4985* (2013.01); *H01L 27/3244* (2013.01); *H01L 51/0034* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

2011/0121352 A1* 5/2011 Hesse .................. H01L 27/301
257/99
2015/0102296 A1 4/2015 Kim et al.

FOREIGN PATENT DOCUMENTS

CN 103682148 A 3/2014
CN 107731790 A 2/2018

OTHER PUBLICATIONS

Office Action of Chinese Patent Application No. 201710711741.4 dated Jun. 21, 2019.

* cited by examiner

*Primary Examiner* — Cheung Lee
(74) *Attorney, Agent, or Firm* — Kilpatrick Townsend & Stockton LLP

(57) ABSTRACT

The present application provides a flexible display panel and a flexible display device containing the flexible display panel. The flexible display panel includes: a flexible substrate, a light-emitting element layer located on a side of the flexible substrate, a packaging layer located on a side of the light-emitting element layer away from the flexible substrate, and a conduction adhering layer located on a side of the flexible substrate away from the packaging layer; the conduction adhering layer being an adhesive layer having electrical conductivity, the conduction adhering layer being connected with an external potential. The conduction adhering layer has a double-side adhering function, and can shield external electromagnetic signal interference to the circuit in the light-emitting element layer, thereby alleviating the picture scintillation phenomenon caused by the external electromagnetic signal interference, improving display effect of the flexible display device, and reducing the module thickness of the flexible display device.

24 Claims, 6 Drawing Sheets

(51) Int. Cl.
  *H01L 23/498* (2006.01)
  *C09J 9/02* (2006.01)
  *C09J 11/04* (2006.01)
  *C09J 201/00* (2006.01)
  *H01L 27/32* (2006.01)
  *C08K 3/04* (2006.01)
  *C08K 3/08* (2006.01)
  *C08K 7/06* (2006.01)
  *H01L 23/60* (2006.01)

(52) U.S. Cl.
  CPC .............. *C08K 3/041* (2017.05); *C08K 3/046* (2017.05); *C08K 3/08* (2013.01); *C08K 7/06* (2013.01); *C08K 2003/0806* (2013.01); *C08K 2201/001* (2013.01); *C08K 2201/011* (2013.01); *H01L 23/60* (2013.01); *H01L 2251/5338* (2013.01); *Y02E 10/549* (2013.01)

FLEXIBLE DISPLAY PANEL AND FLEXIBLE DISPLAY DEVICE

CROSS-REFERENCE TO RELATED APPLICATIONS

The present application claims priority to Chinese Patent Application No. 201710711741.4, filed on Aug. 16, 2017, the content of which is incorporated herein by reference in its entirety.

TECHNICAL FIELD

The present disclosure relates to the field of display techniques and, particularly, relates to a flexible display panel and a flexible display device containing the flexible display panel.

BACKGROUND

Flexible display panel can be defined as a flat display panel made by a thin flexible substrate, which can be bent to have a curvature radius of only a few centimeters or less without damaging its function. Compared with the flat display panel including the rigid liquid crystal display panel and plasma display panel, the flexible display panel has advantages of ultra thin thickness, light weight, long duration, large storage, free design, and being rollable, etc. In recent years, the flexible display techniques have made notable progress, and are widely applied in the display industry, especially in the mobile communication devices. Researches on the flexible display mainly focus on the flexible organic light-emitting diode (OLED) display device, the flexible electronic-ink display (also called flexible electrophoretic display, FEPD) and flexible liquid crystal display (FLCD). Among those, the display with plastic substrate is light weight, ultra thin and presented in an expanded way, having a real flexible display function.

A flexible display device of the prior art generally includes a flexible substrate and the display element layers formed on one side of the flexible substrate. Take the flexible OLED display device for example, the flexible OLED display device includes a flexible OLED display panel, having excellent properties of self-luminescence, high contrast ratio, small thickness, wide visual angle, fast response speed, wide temperature range in use, and simple configuration and single manufacturing procedure, therefore having good developing prospect. Generally, the flexible OLED display panel includes a flexible substrate, a pixel array formed on the flexible substrate, and a control circuit formed on the flexible substrate, each pixel in the pixel array includes an organic light-emitting diode and a thin-film transistor, and the thin-film transistor receives signals from the control circuit by a scan line, a data line and the like to drive the organic light-emitting diode to emit light. During the manufacturing process of the flexible OLED display device, it is necessary to place the flexible substrate on a rigid support substrate for supporting the flexible OLED display panel formed on the flexible substrate, however, the thin flexible substrate may get damaged when peeled off from the support substrate after the manufacturing process is finished; meantime, the friction between the flexible OLED display panel and the support substrate may generate static electricity at the bottom of the flexible substrate, which may cause electrical damage and interference to the control circuit, the signal wiring and the like on the flexible OLED display panel, resulting in display deficiencies such as poor driving and picture scintillation of the flexible OLED display device.

SUMMARY

The purpose of the present disclosure is to provide a flexible display panel and a flexible display device, to solve the problem of great thickness of the module of the flexible display device due to the need of additionally provided conductive shielding film layer for shielding external electromagnetic signal interference.

The present disclosure provides a flexible display panel, including a flexible substrate, a light-emitting element layer located on a side of the flexible substrate, a packaging layer located on a side of the light-emitting element layer away from the flexible substrate, and a conduction adhering layer located on a side of the flexible substrate away from the packaging layer, the conduction adhering layer being an adhesive layer having electrical conductivity, the conduction adhering layer being connected with an external potential.

In addition, the present disclosure further provides a flexible display device, including the flexible display panel as described above.

BRIEF DESCRIPTION OF DRAWINGS

Other features, purposes and advantages of the present disclosure will become apparent by reading the non-restrictive embodiments of the present disclosure described in detail as follows with reference to the following accompanying drawings.

DESCRIPTION OF EMBODIMENTS

The present disclosure is further described as below with reference to the embodiments with the accompany drawings incorporated. It should be understood that, the described specific embodiments are merely used to explain the present disclosure, rather than to limit the present disclosure. It should be further noted that, for illustration convenience, only partial structure related to the present disclosure rather than the complete structure is shown in the figures. Techniques, methods and devices, which are already known to those skilled in related art, are not described in details here; however, in some appropriate situations, these techniques, methods and devices should be viewed as a part of the specification.

In the embodiments illustrated and discussed herein, any specific value should be interpreted to be exemplary, but not to be restrictive. Other examples of the exemplary embodiments can have different values.

It should be noted that, the same reference sign or alphabet in the following drawings represent the same item. Thus, once a certain item is defined in a figure, there may be no need to further define the item in subsequent figures.

Figure 1:
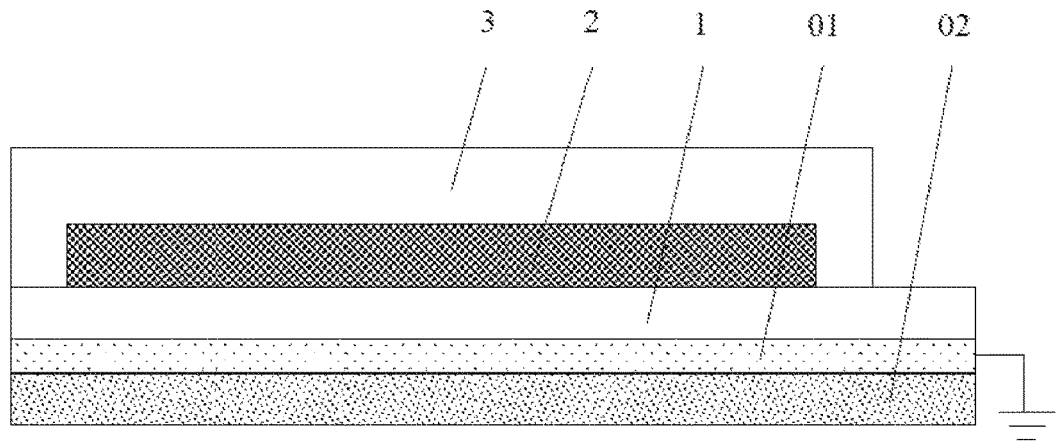
FIG. 1 illustrates a cross-sectional view of a flexible display panel according to an embodiment of the present disclosure.
Figure 2:
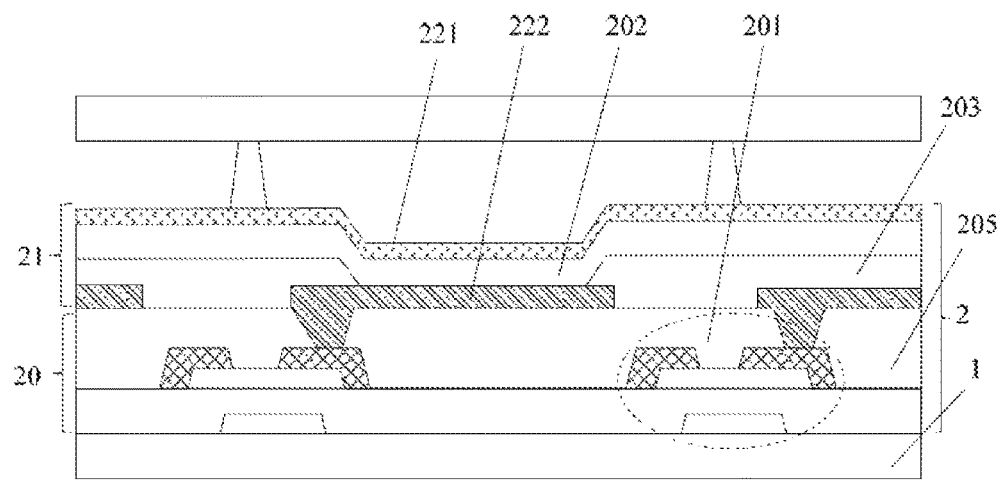
FIG. 2 illustrates a structural schematic diagram of a light-emitting element layer in the flexible display device in FIG. 1.

FIG. 1 illustrates a cross-sectional view of a flexible display panel according to an embodiment of the present disclosure; and FIG. 2 illustrates a structural schematic diagram of a light-emitting element layer in the flexible display device in FIG. 1. As shown in FIGS. 1 and 2, the present disclosure provides a flexible display panel, and the flexible display panel includes a flexible substrate 1, a light-emitting element layer 2 and a packaging layer 3.

The flexible substrate1 can be made of materials, such as plastics, metal foil, ultra-thin soft glass and so on, or be made of other organic or inorganic insulation materials, for example polyimide, which can provide good mechanical property and chemical property. During manufacturing, the flexible substrate 1 is firstly formed on a rigid support substrate, then the light-emitting element layer 2 and the packaging layer 3 are formed on a side of the flexible substrate 1, the packaging layer 3 being located a side of the light-emitting element layer 2 away from the flexible substrate 1, and then a conduction adhering layer 01 is formed on a side of the flexible substrate 1 away from the packaging layer 3, the conduction adhering layer 01 being an adhesive layer having electrical conductivity, the conduction adhering layer being connected to one external potential. In the present embodiment, the conduction adhering layer 01 is grounded so as to conduct the static electricity on the flexible substrate 1 away, thereby preventing and reducing electrical damage or interference to the light-emitting element layer on the flexible substrate caused therefrom.

In one embodiment, the flexible display panel is a flexible OLED display panel. The flexible OLED display panel generally includes a bottom emitting type and a top emitting type. A flexible OLED display panel of the bottom emitting type includes a flexible substrate, a pixel electrode, a cathode and an organic light-emitting material layer, etc. The pixel electrode and the cathode are formed on the flexible substrate, and the organic light-emitting material layer is formed between the pixel electrode and the cathode. Light emitted by the organic light-emitting material layer shoots out of the display panel from a side where the cathode 221 is located. In the present embodiment, the flexible OLED display panel of the top emitting type is illustrated for example. In the present embodiment, the light-emitting element layer 2 is an organic light-emitting element layer formed by an organic light-emitting diode. Specifically, the light-emitting element layer 2 includes an organic light-emitting unit 21 and a drive array layer 20, and the organic light-emitting unit 21 includes a pixel electrode 222, a pixel defining layer 203, a cathode 221, and an organic light-emitting material layer 202 located between the pixel electrode 222 and the cathode 221. The pixel defining layer 203 is configured to separate a plurality of pixel electrodes 222, so as to form a plurality of organic light-emitting units arranged in an array. In one embodiment, the pixel electrodes 222 can be made of indium tin oxide (ITO) or metals, for example silver-aluminum alloy, aluminum, etc., as long as there is a matched work function between the pixel electrodes 222 and the organic light-emitting material layer 202, so that light emitted by the organic light-emitting material layer 202 can substantially shoot out from a side where the cathode 221 is located, thereby guaranteeing the light utilization efficiency of the flexible display device formed by the OLED display panel, which is not limited in the present disclosure. The cathode 221 can be made of indium tin oxide (ITO) or metals, for example silver-aluminum alloy, aluminum, etc.

In one embodiment, the organic light-emitting material layer 202 includes a hole transmission layer, a light-emitting layer, and an electron transmission layer. When there is suitable voltage between the pixel electrode 222 and the cathode 221, the positive holes in the hole transmission layer and the cathode charges combine in the light-emitting layer so as to generate light. The organic light-emitting material layer 202 is made of materials having strong fluorescence in solid state, good carrier transmission performance, good thermal stability and chemical stability, high quantum efficiency, and capability of vacuum evaporation. It should be noted that, since an organic material suitable for transmitting electrons may not be suitable for transmitting holes, the electron transmission layer and the hole transmission layer in the organic light-emitting material layer 202 should adopt different organic materials or adopt the same organic material doped with different impurities. At present, the most commonly used material for making the electron transmission layer has properties of high film making stability, good thermal stability, and good electron transport performance, for example, fluorescent dye compounds, such as anthradiazole derivatives, derivatives containing naphthalene ring(s), 1-naphthyl, 3-methylphenyl, etc. The hole transmission layer is made of an aromatic amine fluorescent compound, for example 1-naphthyl and the like.

The drive array layer 20 includes a plurality of thin-film transistors 201 formed on the flexible substrate 1 and a flat layer 205 on the thin-film transistors 201. The thin-film transistors of the bottom gate type are illustrated for example. The thin-film transistor 201 includes a gate electrode on the flexible substrate, a gate insulation layer placed on the gate electrode, an active layer placed on the gate insulation layer and corresponding to the gate electrode, a source electrode placed on the active layer, a drain electrode placed on the active layer and insulated from the source electrode, a scan line (not shown in the drawings), and a data line (not shown in the drawings). The scan line of the drive array layer 20 and the gate electrode are located in a same layer, and are formed in a same patterning process. Similarly, the data line of the drive array layer 20, the source electrode, and the drain electrode can be located in a same layer, and be formed in a same patterning process. It should be noted that the source electrode and the drain electrode are located in a pattern layer, and are formed in a same patterning process in the present embodiment, of course, the source electrode and the drain electrode can be formed in different pattern layers, and are separately formed in one patterning process, which is not limited herein.

The flat layer 205 is generally made of insulation materials, for example, silicon oxide, silicon nitride, hafnium oxide, resin, etc. The pixel electrode 222 located on the flat layer 205 penetrates through the through hole in the flat layer 205 to be electrically connected with the drain electrode of the thin-film transistor 201. When the gate electrode of the thin-film transistor 201 receives a driving signal sent from the scan line, an conduction channel of the active layer is turned on, the source electrode and the drain electrode of the thin-film transistor 201 are electrically communicated with each other, so that a data signal from the data line is transmitted from the source electrode to the drain electrode, and then to the pixel electrode 222 electrically connected with the drain electrode. After the pixel electrode 222 obtains the data signal, the voltage difference between the pixel electrode 222 and the cathode 221 facilitates the organic light-emitting material layer 202 located between the pixel electrode 222 and the cathode 221 to emit light, and the light emitted by the organic light-emitting material layer 202 shoot out through the cathode 221.

The drive array layer 20 further includes a control circuit located on the flexible substrate, for providing a driving signal for the scan line and the data line. The scan line and the data line transmit the driving signal provided by the control circuit to the thin-film transistor, to drive the organic light-emitting unit to emit light and display.

The packaging layer 3 is placed on the flexible substrate 1 and covers the light-emitting element layer 2. A packaging adhesive is coated between the flexible substrate and the packaging layer in the marginal area, and is cured by UV light, so that the light-emitting element layer is packaged in the packaging layer and the flexible substrate. The packaging layer herein for example can be constituted by organic barrier layers and inorganic barrier layers alternatively stacked with the organic barrier layers, and thus has high compactness, which can extend the permeation path of water and oxygen, and meantime decrease the stress inside the packaging layer, so that corrosion of external active substances, such as water, oxygen and so on, to the light-emitting element layer in the flexible OLED display panel can be effectively reduced, and the packaging layer may not easily crack.

In the present embodiment, the conduction adhering layer 01 is an adhesive layer having conductivity and double-side adhesive function. According to actual demands of products, other film layer or rigid protection structure can be adhered on the bottom of the flexible substrate, or the flexible substrate is fixed on other rigid structure, so as to shield damage and electrical interference of external electromagnetic signals to the light-emitting element layer on the flexible substrate, thereby improving the picture scintillation phenomenon caused by the external electromagnetic signal interference, and improving the display effect of the flexible display device. That is to say, the conduction adhering layer 01 needs to maintain certain conductivity and viscosity, for example, the square resistance of the material forming the conduction adhering layer 01 is less than $1*10^9 \Omega$, so as to guarantee that the conduction adhering layer 01 has conductivity and thus has electromagnetic shielding function. The peeling strength of the conduction adhering layer 01 is in a range of 5 N/inch-20 N/inch, so as to guarantee that the conduction adhering layer 01 has certain viscosity suitable for being used as an adhesive layer.

In one embodiment, the conduction adhering layer 01 can include an adhesive filled with a conductive filler, that is, the adhesive is used as a matrix, and the additionally filled conductive filler imparts the adhesive with conductivity, so that the viscosity thereof is mainly determined by the matrix and the electrical properties are mainly determined by the conductive filler. The adhesive used as the matrix may be adhesive systems, such as organic silicon resin, polyimide resin, phenolic resin, polyurethane, acrylic resin and the like, and those adhesives after being cured can form a molecular skeleton structure of the conduction adhering layer, which imparts the conduction adhering layer with mechanical properties and bonding properties, and makes the filled conductive filler form a channel. The conductive filler herein can include one or more of metal powders and conductive compounds with low electrical resistivity, and the metal powders herein may include gold power, silver powder, copper powder, aluminum powder, zinc power, iron powder, and nickel powder. For example, a conductive adhesive filled with silver powder is used in the present embodiment. The silver power has excellent electrical conductivity, thermal conductivity, and chemical stability at normal temperature, and its volume resistivity is $1.59*10^{-6} \Omega \cdot cm$. The silver particles in the silver powder are sheet-like or spherical, and electrical conduction channels are formed by mutual contact of the silver particles. The conduction adhering layer with the silver powder as the filler has properties of high electrical conductivity, strong resistance to migration, and good electrical conduction stability.

The conductive filler herein may also include conductive nanowires, for example, silver nanowires or carbon nanotubes, etc. The electrical resistivity of the conduction adhering layer filled with the silver nanowires can be not greater than $10^{-4} \Omega \cdot cm$, and thus the conduction adhering layer has good electrical conduction effect, good shear strength, and good ageing-resistant performance, and can work at a low working temperature.

Further, during use of the flexible display panel, the flexible substrate 1 may suffer accidental damage, for example, impact, collision, scratch, and the like, which may cause unrecoverable damage to the flexible display panel, or in a severe case directly influence the use of the flexible display device. Therefore, in the present embodiment, in order to protect the flexible substrate 1, the flexible display panel further includes a bottom protection film 02 for blocking external damaging factors. The conduction adhering layer 01 is located between the flexible substrate 1 and the bottom protection film 02, and the bottom protection film 02 is attached onto a side of the flexible substrate 1 away from the packaging layer 3 as a function of the adhesiveness of the conduction adhering layer 01. During manufacturing, one conduction adhering layer is firstly coated onto the bottom of the flexible substrate, and then the bottom protection film is laminated onto a lower surface of the flexible substrate by a laminating process. The material of the bottom protection film can be polyethylene terephthalate (PET) or metal material.

In the flexible display panel provided by the present embodiment, the conduction adhering layer is an adhesive layer having electrical conductivity and double-side adhesive function, which can adhere the bottom protection film onto the bottom of the flexible substrate. Meantime, since the conduction adhering layer has electrical conductivity and is connected to an external potential, damage and interference to the light-emitting element layer on the flexible substrate due to the external electromagnetic signal can be shielded, thereby alleviating the picture scintillation phenomenon caused by the external electromagnetic signal interference, and improving the display effect of the flexible display device. In addition, since the conduction adhering layer has both adhering function and electromagnetic shielding function, there is no need to provide separate adhesive layer and conduction shielding layer between the bottom protection film and the flexible substrate, so that the total number of the film layers in the flexible display device can be reduced, thereby reducing the module thickness of the flexible display device containing the flexible display panel.

Figure 3:
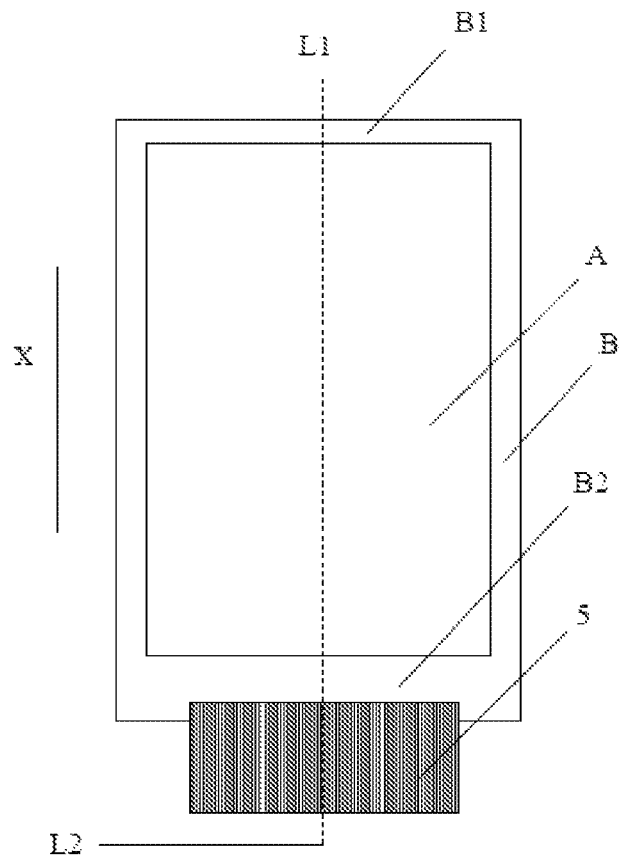
FIG. 3 illustrates a schematic diagram of a flexible display panel according to another embodiment of the present disclosure.
Figure 4:
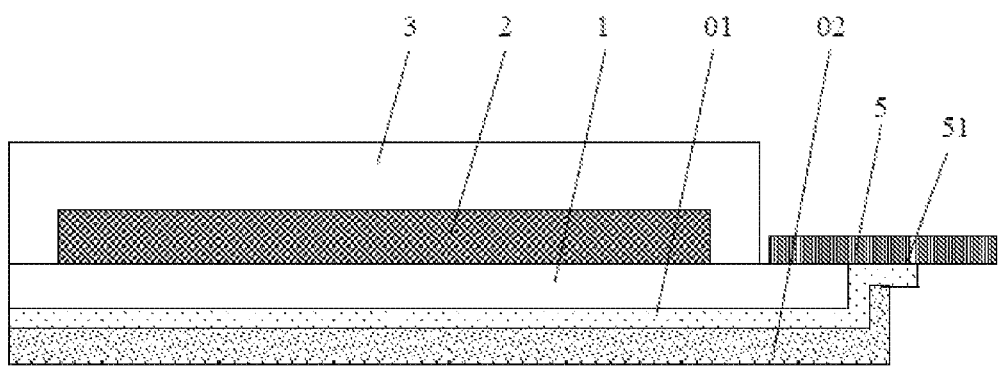
FIG. 4 illustrates a cross-sectional view along line L1-L2 in FIG. 3.

FIG. 3 illustrates a schematic diagram of a flexible display panel according to another embodiment of the present disclosure, and FIG. 4 illustrates a cross-sectional view along line L1-L2 in FIG. 3. With reference to FIGS. 2, 3, and 4, the flexible display panel provided by the present embodiment has similar configuration with the flexible display panel shown in FIG. 1 and includes a flexible substrate 1, a light-emitting element layer 2, a packaging layer 3, a conduction adhering layer 01, and a bottom protection film layer 02. The light-emitting element layer 2 is located on a side of the flexible substrate 1, and the packaging layer 3 is located on a side of the light-emitting element layer 2 away from the flexible substrate 1, so that the light-emitting element layer 2 is sealed in a sealing space formed between the flexible substrate and the packaging layer. The conduction adhering layer 01 is an adhesive layer having electrical conductivity, and is located on a side of the flexible substrate 1 away from the packaging layer 3. In addition, the conduction adhering layer is connected to an external potential. In the present embodiment, the flexible display panel may be a flexible OLED display panel. The specific configuration of the flexible OLED display panel can refer to FIG. 2. The difference lies in that, the flexible display panel in the present embodiment further includes a flexible circuit board 5, and the conduction adhering layer 01 is electrically connected with a potential interface 51 of the flexible circuit board 5. The flexible circuit board 5 provides a stable external potential for the conduction adhering layer 01 via the potential interface 51. It should be noted that, the external potential can also be a ground potential.

In one embodiment, the flexible substrate 1 includes a display area A and a border area B surrounding the display area A. The border area B includes an upper border area B1 and a lower border area B2, and the upper border area B1 and the lower border area B2 are opposite to each other in a first direction X. The display area A is located between the upper border area B1 and the lower border area B2. The flexible circuit board 5 is bound to the lower border area B2 of the flexible substrate 1, and the flexible circuit board 5 is provided with a display driving module for providing driving signal for the light-emitting element layer.

Figure 5:
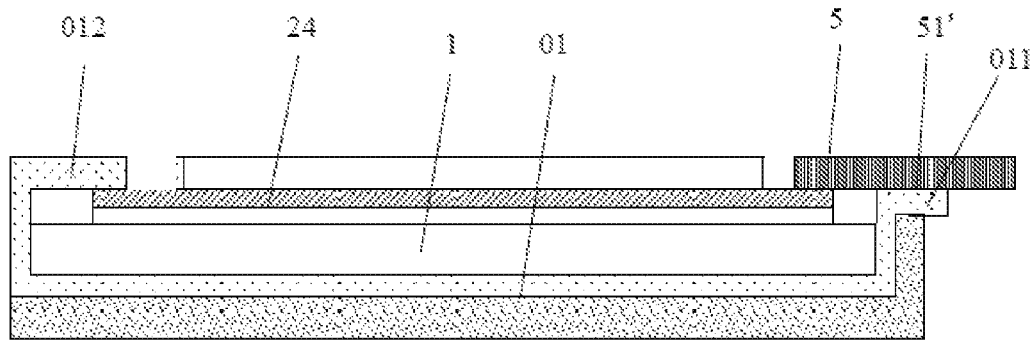
FIG. 5 illustrates a cross-sectional view of a flexible display panel according to another embodiment of the present disclosure.

FIG. 5 illustrates a cross-sectional view of a flexible display panel according to still another embodiment of the present embodiment. With reference to FIGS. 2, 3, and 5, the flexible display panel provided by the present embodiment has similar configuration with the flexible display panel shown in FIG. 4 and includes a flexible substrate, a light-emitting element layer, a packaging layer, a conduction adhering layer, and a bottom protection film. The light-emitting element layer is located on a side of the flexible substrate, and the packaging layer is located on a side of the light-emitting element layer away from the flexible substrate, so that the light-emitting element layer is sealed in a sealing space formed between the flexible substrate and the packaging layer. The conduction adhering layer is an adhesive layer having electrical conductivity. The bottom protection film is laminated onto a back surface of the flexible substrate as a function of the adhesiveness of the conduction adhering layer. The conduction adhering layer is electrically connected with one potential interface on the flexible circuit board, and the flexible circuit board provides a stable external potential for the conduction adhering layer via the potential interface. In the present embodiment, the flexible display panel can be a flexible OLED display panel. The specific configuration of the flexible OLED can refer to FIG. 2.

The difference lies in that, the light-emitting element layer of the present embodiment further includes a plurality of organic light-emitting units and power lines 24 for providing driving voltage for the organic light-emitting units. The power lines 24 pass across the display area of the flexible display panel, and extend from the lower border area of the flexible substrate to the upper border area of the flexible substrate. The conduction adhering layer 01 includes a first edge 011 corresponding to the lower border area and a second edge 012 corresponding to the upper border area, and the first edge 011 is electrically connected with a power interface 51' on the flexible circuit board 5. The flexible circuit board 5 provides a same external potential as the power voltage for the conduction adhering layer 01 via the power interface 51'. Meantime, the second edge 012 of the conduction adhering layer 01 is electrically connected with ends of the power lines located in the upper border area, so that in the working state of the flexible display device, the conduction adhering layer 01 has the same potential as the power lines 24, that is, in addition to the adhering function and the electromagnetic shielding function, the conduction adhering layer can further be used as a part of the power lines, to be used as an auxiliary power line.

Different from the liquid crystal display module which uses a stable voltage for controlling the brightness, in the flexible OLED display device, the organic light-emitting diode display module of the light-emitting element layer is driven by current, that is, a stable current is necessary to control emitting of light. The electric resistance of the power line connected with the organic light-emitting units on the display panel and the IR-drop caused by the charge consumed by the pixels when emitting light may cause non-uniform display, such that the organic light-emitting unit close to the display drive module is brighter, and the further the organic light-emitting unit away from the organic the display drive module, the darker the light-emitting layer is. The display drive module is placed in the lower border area, therefore, the organic light-emitting unit closer to the lower border area is brighter, and the closer the organic light-emitting unit to the upper border area, the darker the organic light-emitting unit is, so that the whole picture display effect is influenced. In the present embodiment, the first edge of the conduction adhering layer is electrically connected with the power interface on the flexible circuit board, a second edge of the conduction adhering layer is electrically connected with an end of the power line located in the upper border area, so that in the working state of the flexible display device, the conduction adhering layer is further used as a part of the power line, which increases the thickness of the power line, reduces the resistance of the power line, improves the electrical conductivity of the power line, such that the organic light-emitting unit close to the lower border area and the organic light-emitting unit close to the upper border area have uniform brightness, thereby improving the whole picture display effect.

Figure 6:
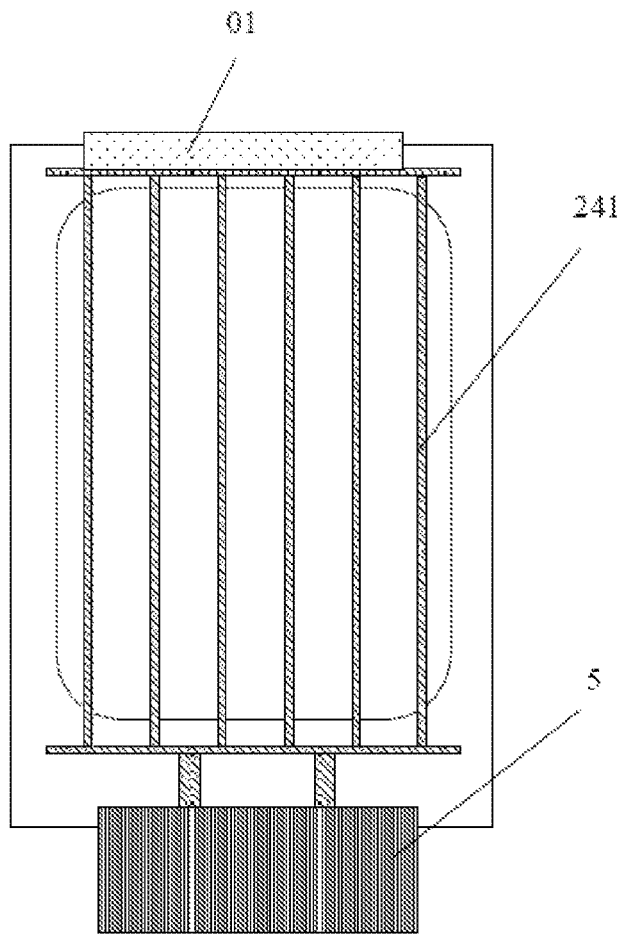
FIG. 6 illustrates a cross-sectional view of a flexible display panel according to another embodiment of the present disclosure.

FIG. 6 illustrates a cross-sectional view of a flexible display panel according to still another embodiment of the present disclosure. The flexible display panel provided by the present embodiment has similar configuration with the flexible display panel shown in FIG. 5, including a flexible substrate, a light-emitting element layer, a packaging layer, and a conduction adhering layer. The difference lies in that, the power line in the present embodiment is a high-potential power line 241, one end of the high-potential power line 241 is electrically connected with a high-potential power interface on the flexible circuit board 5, and the high-potential power line 241 provides a high-potential power Vdd for the organic light-emitting unit of the light-emitting element layer. Meantime, the first edge of the conduction adhering layer 01 is also electrically connected with the high-potential power interface on the flexible circuit board 5, and the second edge of the conduction adhering layer 01 is electrically connected with the other end of the high-potential power line 241 away from the flexible circuit board 5, so that in working state of the flexible display device, the conduction adhering layer is further used as a part of the high-potential power line, which increases the thickness of the high-potential power line, reduces the resistance of the high-potential power line, improves the electrical conductivity of the high-potential power line, and thus reduces the IR-drop on the high-potential power line, such that the organic light-emitting unit close to the lower border area and the organic light-emitting unit close to the upper border area tends to have uniform brightness, thereby improving the whole picture display effect. Meantime, the conduction adhering layer is connected with a high-potential power interface on the flexible circuit board, and thus has a stable external potential, which can shield damage and interference of external electromagnetic signal to the light-emitting element layer on the flexible substrate, thereby alleviating the picture scintillation phenomenon caused by the external electromagnetic signal interference, and improving the display effect of the flexible display device. In addition, since the conduction adhering layer has both adhering function and electromagnetic shielding function, there is no need to separately provide an adhesive layer and a conduction shielding layer between the bottom protection film and the flexible substrate, so that the total number of the film layers in the flexible display device is reduced, and thus the module thickness of the flexible display device is reduced.

Figure 7:
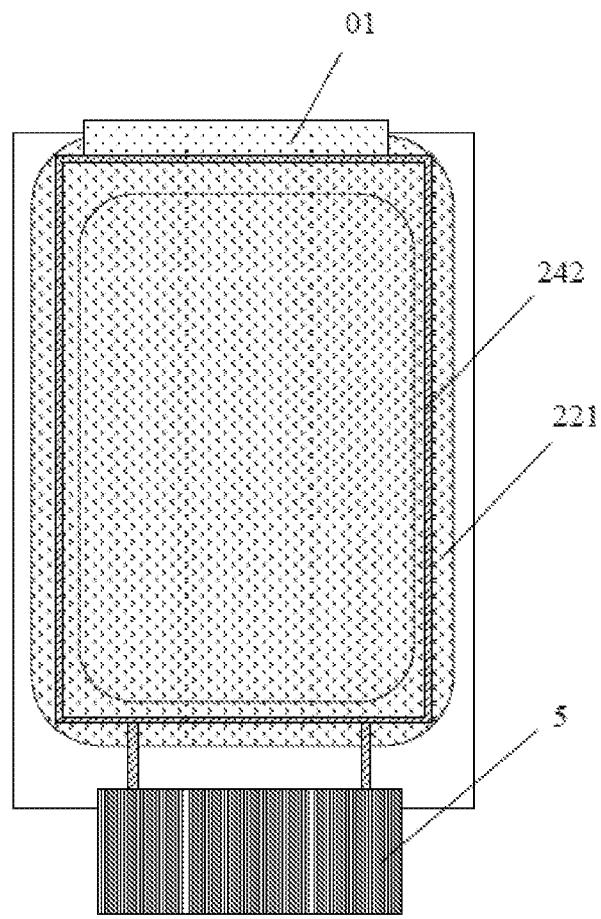
FIG. 7 illustrates a cross-sectional view of a flexible display panel according to another embodiment of the present disclosure.

FIG. 7 illustrates a cross-sectional view of a flexible display panel according to still another embodiment of the present embodiment. The flexible display panel provided by the present embodiment has similar configuration with the flexible display panel shown in FIG. 5, including a flexible substrate, a light-emitting element layer, a the packaging layer, and a conduction adhering layer. The difference lies in that, the power line in the present embodiment is a low-potential power line 242, and one end of the low-potential power line 242 is electrically connected with a low-potential power interface on the flexible circuit board 5. The low-potential power line 242 provides a low-potential power Vee for the organic light-emitting unit of the light-emitting element layer. As shown in FIG. 2 and FIG. 7, the flexible display panel in the present embodiment further includes a the cathode 221 with a undivided surface covering the display area, the low-potential power line 242 is located in the border area and surrounds the display area. The low-potential power line 242 directly contacts the cathode 221, and provides the low-potential power Vee for the organic light-emitting unit of the light-emitting element layer by the cathode 221.

Meantime, the first edge of the conduction adhering layer 01 is also electrically connected with the low-potential power interface on the flexible circuit board 5, and the second edge of the conduction adhering layer 01 is electrically connected with the other end of the low-potential power line 242 away from the flexible circuit board 5, so that in the working state of the flexible display device, the conduction adhering layer is further used as a part of the low-potential power line, which increases the thickness of the low-potential power line, reduces the resistance of the low-potential power line, improves the electrical conductivity of the low-potential power line, and thus reduces the IR-drop on the low-potential power line, such that the organic light-emitting unit close to the lower border area and the organic light-emitting unit close to the upper border area tend to have uniform brightness, thereby improving display effect of the entire picture. Meantime, the conduction adhering layer is connected with the low-potential power interface on the flexible circuit board, and thus has a stable external potential, such that the damage and interference of external electromagnetic signal to the light-emitting element layer on the flexible substrate can be shielded, thereby alleviating the picture scintillation phenomenon caused by the external electromagnetic signal interference, improving the display effect of the flexible display device. In addition, since the conduction adhering layer has both adhering function and electromagnetic shielding function, there is no need to separately provide an adhesive layer and a conduction shielding layer between the bottom protection film and the flexible substrate, thereby reducing the total number of the film layers in the flexible display panel, and thus reducing the module thickness of the flexible display device.

Figure 8:
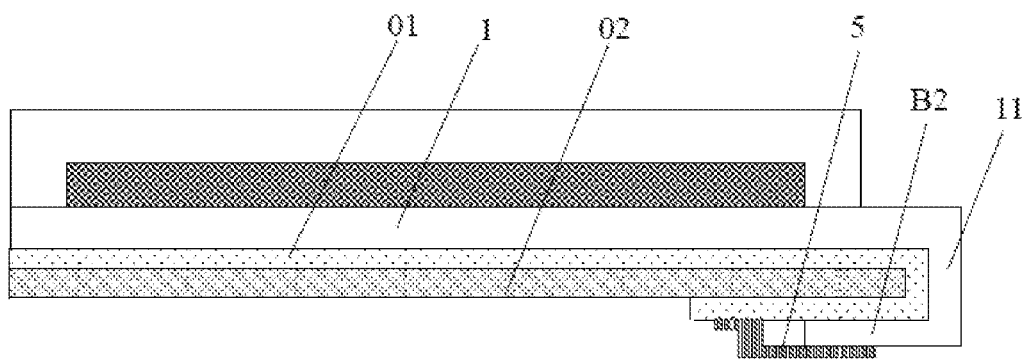
FIG. 8 illustrates a cross-sectional view of a flexible display panel according to another embodiment of the present disclosure.

FIG. 8 illustrates a cross-sectional view of a flexible display device according to still another embodiment of the present disclosure. With reference to FIG. 2 and FIG. 8, the flexible display device provided by the present embodiment has similar configuration with the flexible display device shown in FIG. 1 and includes a flexible substrate 1, a light-emitting element layer, a packaging layer, a conduction adhering layer 01, and a bottom protection film 02. The conduction adhering layer 01 is adhered to a side of the flexible substrate 1 away from the packaging layer, such that the conduction adhering layer is connected with an external potential. In the present embodiment, the flexible display device can be a flexible OLED display device, and the specific configuration of the flexible OLED display device can refer to FIG. 2. The difference lies in that, the flexible display panel in the present embodiment is designed as a bending step, and the flexible substrate 1 includes a display area, a lower border area, and a bending area 11 located between the display area and the lower border area. The lower border area B2 of the flexible substrate 1 used for being bonded to the flexible circuit board 5 is bent outwardly across the bending area 11 to be laminated onto the back surface of the flexible display panel, and the end portion of the conduction adhering layer 01 is adhered and fixed onto a side of the bottom protection film 02 away from the light-emitting element layer, such that the flexible circuit board 5 is bounded to the lower border area B2, and the end portion of the conduction adhering layer 01 is electrically connected with one external potential interface on the flexible circuit board 5.

Since the flexible substrate of the flexible display device is thin and has poor flexibility, the flexible display element is easily damaged during use, and also readily deforms, which severely influences the user experience and service life of the flexible display element. Therefore, in practical manufacturing process, the bottom protection film needs to have a certain thickness and rigidity for supporting the flexible substrate and the components on the flexible substrate, so as to well protect the flexible substrate and extend the service life of the flexible display device. However, the thickness and rigidity of the bottom protection film in turn causes bending difficulties to the bottom protection film. In view of this, in the present embodiment, the lower border area of the flexible substrate used to be bounded with the flexible circuit board is bent outwardly across the conduction adhering layer to be laminated onto the back surface of the bottom protection film. Therefore, it is merely necessary to bend the flexible substrate and the conduction adhering layer, and there is no need to provide any additional bending area for bottom protection film for extending and correspondingly protecting the lower border area of the flexible substrate. The bottom protection film protects and supports the entire flexible substrate, and meantime the width of the border of the flexible display device is reduced, which facilitates the narrowing of the border. In addition, since the conduction adhering layer has both adhering function and electromagnetic shielding function, there is no need to separately provide an adhesive layer and a conduction shielding layer between the bottom protection film and the flexible substrate, so that the total number of the film layers in the flexible display panel is reduced, and thus the module thickness of the flexible display device is reduced.

Figure 9:
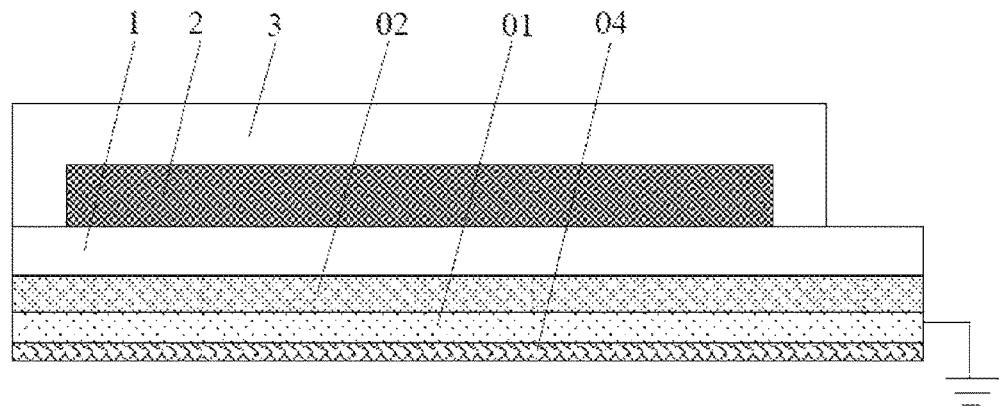
FIG. 9 illustrates a cross-sectional view of a flexible display panel according to another embodiment of the present disclosure.

FIG. 9 illustrates a schematic diagram of a flexible display pane according to still another embodiment of the present disclosure. The flexible display panel in the present embodiment includes a flexible substrate 1, a light-emitting element layer 2, a packaging layer 3, a bottom protection film 02, a conduction adhering layer 01, and a heat conduction sheet 04. The light-emitting element layer 2 is placed on one side of the flexible substrate 1, and the packaging layer 3 is placed on a side of the light-emitting element layer 2 away from the flexible substrate 1, such that the light-emitting element layer 2 is sealed in a sealing space formed by the flexible substrate 1 and the packaging layer 3. The conduction adhering layer 01 is an adhesive layer having electrical conductivity, the heat conduction sheet 04 is adhered and fixed onto a side of the bottom protection film 02 away from the flexible substrate 1 as a function of the conduction adhering layer 01, and the conduction adhering layer 01 is connected with a stable external potential. The external potential can be a ground potential. In the present embodiment, the flexible display panel can be a flexible OLED display panel, and the specific configuration of the flexible OLED display panel can refer to FIG. 2.

The heat dissipation of the flexible display panel, particularly, the heat dissipation of the flexible OLED display panel, is an important factor that influences picture quality and service life of the displayer. If heat is not radiated out in time and the temperature of the entire screen rises, various adverse consequences may be caused. In the present embodiment, a heat conduction sheet 04 is provided in the flexible display panel for dissipating heat, thereby improving the picture display quality and service life. The material of the heat conduction sheet 04 may include heat conductive silicon rubber, heat conductive acrylic resin, or metal material, for example, aluminum sheet with good heat dissipation. Further, in the present embodiment, the heat conduction sheet is adhered in the flexible display panel by the conduction adhering layer. The conduction adhering layer is doped with heat conductive metal materials such as metal powders or metal nanowires, such that the conduction adhering layer has both electrical conductivity and improved thermal conductivity of the adhesive layer, and thus the conduction adhering layer can assist the heat conduction sheet to reach good heat dissipation effect. Therefore, in the present embodiment, the conduction adhering layer can have both the adhering function and the electromagnetic shielding function at the same time, there is no need to separately provide an adhesive layer and a conduction shielding layer between the heat conduction sheet and the bottom protection film, thereby reducing the total number of the film layers in the flexible display device, and thus reducing the module thickness of the flexible display device. Meantime, the heat dissipation effect of the heat conduction sheet is improved, and picture display quality and display life of the flexible display device is also improved.

Besides, the present disclosure further provides a flexible display device, including the flexible display panel as described in any embodiment above. The flexible display device can be mobile phone, tablet PC, display of computer, displayer applied in smart wearable device, display device applied in transportation vehicles such as cars, etc., which is not limited in the present disclosure.

Figure 10:
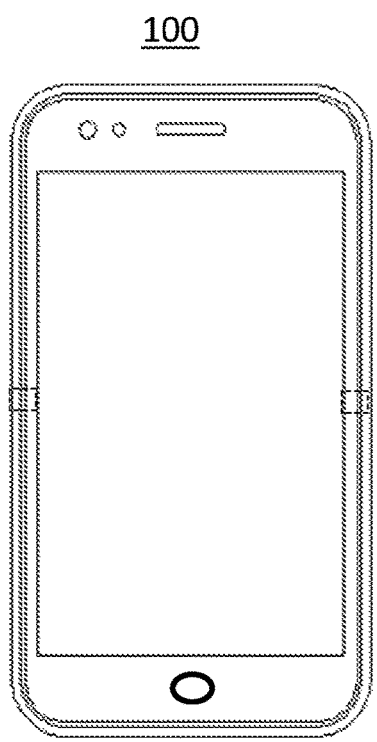
FIG. 10 illustrates a schematic diagram of a flexible display device according to an embodiment of the present disclosure.
Figure 11:
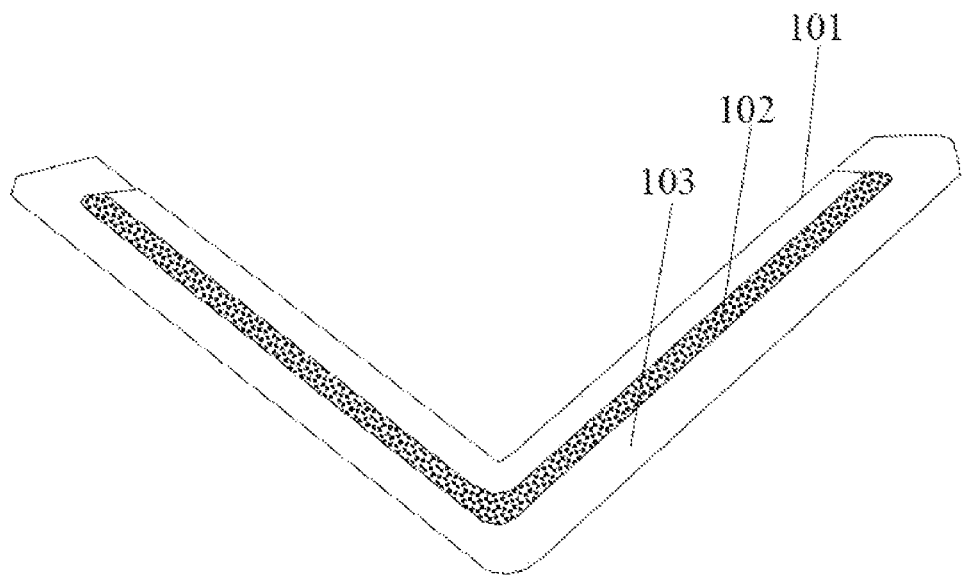
FIG. 11 illustrates a lateral view of the flexible display device shown in FIG. 10 when being in a bending state.
Figure 12:
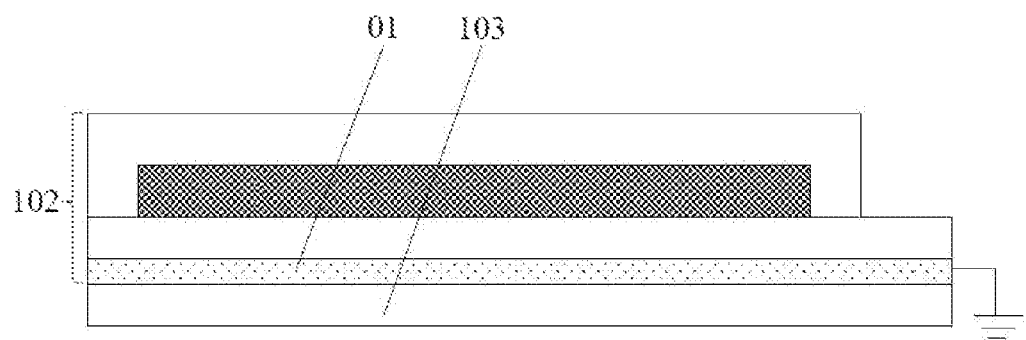
FIG. 12 illustrates a partial cross-sectional view of the flexible display device shown in FIG. 10.

A foldable mobile phone is illustrated for example in the present disclosure. With reference to FIGS. 10-12, FIG. 10 illustrates a schematic diagram of a flexible display device according to still another embodiment of the present disclosure, FIG. 11 illustrates a lateral view of the flexible display device shown in FIG. 10 in a bending state, and FIG. 12 illustrates a partial cross-sectional view of the flexible display device shown in FIG. 10. The flexible display device 100 in the present embodiment is for example a foldable mobile phone, and the flexible display device 100 can symmetrically bend along a horizontal line in its central portion, such that the two portions above and below the horizontal line overlap with each other after folding, thereby reducing the apparent volume of the flexible display device and making the flexible display device portable. It should be noted that, the above-mentioned foldable flexible display device can also be folded in other manners, which is not limited in the present disclosure.

The flexible display device100 includes a covering plate 101, a flexible display panel 102, and a rigid housing 103 for protecting and supporting the flexible display panel 102. The flexible display panel 102 is sandwiched between the covering plate 10 and the rigid housing 103. The specific configuration of the flexible display panel 102 can refer to FIGS. 1-9, and the flexible display panel 102 can be any one of the flexible display panels as shown in FIGS. 1-9. The rigid housing 103 can be designed into a plurality of parts connected with each other according to actual demands, and the parts can bend toward each other. As shown in FIG. 11, the rigid housing 103 is adhered and fixed onto the back surface of the flexible display panel 102 as a function of the conduction adhering layer 01 at the bottom of the flexible display panel 102, for protecting and supporting the flexible display panel 102. The material of the rigid housing 103 includes plastics or metal, for example, aluminum alloy, etc.

Further, the conduction adhering layer 01 in the present embodiment is connected with a ground potential. When the rigid housing 103 is made of a metal material, the conduction adhering layer 01 can be directly connected with the rigid housing to realize grounding.

In the present embodiment, the conduction adhering layer is generally grounded, so as to shield the damage and interference of the external electromagnetic signal to the light-emitting element layer in the flexible display device, thereby improving the picture scintillation phenomenon caused by the external electromagnetic signal interference and improving the display effect of the flexible display device. In addition, since the conduction adhering layer has both adhering function and electromagnetic shielding function at the same time, there is no need to separately provide an adhesive layer and a conduction shielding layer between the rigid housing and the flexible display panel, so that the total number of film layers in the flexible display device is reduced, and thus the module thickness of the flexible display device is reduced.

The above-mentioned are embodiments of the present disclosure and the technical principles used. Those skilled in the art can understand that, the present disclosure is not limited to the specific embodiments here, and for the person skilled in the art, the present disclosure can have a variety of obvious changes, modifications and replacements without departing from the protection scope of the present disclosure. Though the present disclosure is described as above, the present disclosure is not limited to the above embodiments, and can further include many other equivalent embodiments, and the protection scope of the present disclosure is determined by the scope of the attached claims.

What is claimed is:

1. A flexible display panel, comprising:
a flexible substrate;
a light-emitting element layer located on a side of the flexible substrate;
a packaging layer located on a side of the light-emitting element layer away from the flexible substrate; and
a conduction adhering layer located on a side of the flexible substrate away from the packaging layer, the conduction adhering layer being an adhesive layer having electrical conductivity, the conduction adhering layer being connected with an external potential.

2. The flexible display panel according to claim 1, wherein the external potential is a ground potential.

3. The flexible display panel according to claim 1, further comprising a flexible circuit board, wherein the flexible substrate comprises an upper border area, a lower border area opposite to the upper border area in a first direction, and a display area located between the upper border area and the lower border area, and the flexible circuit board is bounded to the lower border area; and
the conduction adhering layer is electrically connected with a potential interface on the flexible circuit board, and the flexible circuit board is configured to provide the external potential for the conduction adhering layer.

4. The flexible display panel according to claim 3, wherein the light-emitting element layer comprises a plurality of organic light-emitting units and a power line for providing a driving voltage for the organic light-emitting units, and the power line extends from the lower border area to the upper border area;
the conduction adhering layer comprises a first edge corresponding to the lower border area and a second edge corresponding to the upper border area, the first edge is electrically connected with a power interface on the flexible circuit board, and the second edge is electrically connected with an end of the power line in the upper border area.

5. The flexible display panel according to claim 4, wherein the power line is a high-potential power line configured to provide a high-potential power for the organic light-emitting units.

6. The flexible display panel according to claim 4, wherein the power line is a low-potential power line configured to provide a low-potential power for the organic light-emitting units.

7. The flexible display panel according to claim 6, wherein each of the organic light-emitting units comprises a pixel electrode, a cathode, and an organic light-emitting material layer located between the pixel electrode and the cathode, and the low-potential power line is electrically connected with the cathode.

8. The flexible display panel according to claim 1, further comprising a bottom protection film, wherein the bottom protection film is adhered onto a side of the flexible substrate away from the packaging layer as a function of adhesiveness of the conduction adhering layer.

9. The flexible display panel according to claim 8, wherein the flexible substrate comprises an upper border area, a lower border area opposite to the upper border area in a first direction, a display area located between the upper border area and the lower border area, and a bending area between the display area and the lower border area, wherein the lower border area is fixed onto a side of the bottom protection film away from the flexible substrate by the conduction adhering layer.

10. The flexible display panel according to claim 8, wherein a material of the bottom protection film comprises polyethylene terephthalate or metal.

11. The flexible display panel according to claim 1, further comprising a heat conduction sheet, wherein the heat conduction sheet is directly laminated onto a side of the conduction adhering layer away from the flexible substrate.

12. The flexible display panel according to claim 11, wherein the heat conduction sheet is made of heat conduction silicon rubber, heat conduction acrylic resin, or metal.

13. The flexible display panel according to claim 11, further comprising a bottom protection film, wherein the bottom protection film is located between the flexible substrate and the conduction adhering layer, and the heat conduction sheet is adhered onto a side of the bottom protection film away from the flexible substrate as a function of adhesiveness of the conduction adhering layer.

14. The flexible display panel according to claim 13, wherein a material of the bottom protection film comprises polyethylene terephthalate or metal.

15. The flexible display panel according to claim 1, wherein a square resistance of the conduction adhering layer is less than $1*10^9 \Omega$.

16. The flexible display panel according to claim 1, wherein a peeling strength of the conduction adhering layer is in a range of 5 N/inch - 20 N/inch.

17. The flexible display panel according to claim 1, wherein a material of the conduction adhering layer comprises an adhesive filled with a conductive filler.

18. The flexible display panel according to claim 17, wherein the adhesive comprises organic silicon resin, polyimide resin, phenolic resin, polyurethane or acrylic resin.

19. The flexible display panel according to claim 17, wherein the conductive filler comprises a metal powder.

20. The flexible display panel according to claim 19, wherein the metal powder comprises a silver powder.

21. The flexible display panel according to claim 17, wherein the conductive filler comprises a conductive nanowire.

22. The flexible display panel according to claim 21, wherein the conductive nanowire comprises a silver nanowire or a carbon nanotube.

23. A flexible display device, comprising:
a rigid housing and a flexible display panel,
wherein the flexible display panel comprises:
a flexible substrate;
a light-emitting element layer located on a side of the flexible substrate;
a packaging layer located on a side of the light-emitting element layer away from the flexible substrate; and
a conduction adhering layer located on a side of the flexible substrate away from the packaging layer, the conduction adhering layer being an adhesive layer having electrical conductivity, the conduction adhering layer being connected with an external potential;

wherein the rigid housing is fixed on a back surface of the flexible display panel as a function of adhesiveness of the conduction adhering layer.

24. The flexible display device according to claim 23, wherein a material of the rigid housing comprises a metal material, and the conduction adhering layer is grounded by the rigid housing.

* * * * *